United States Patent [19]

Jang

[11] Patent Number: 5,781,487
[45] Date of Patent: Jul. 14, 1998

[54] BIT LINE SELECTION CIRCUIT

[75] Inventor: Seong Jin Jang, Seoul, Rep. of Korea

[73] Assignee: LG Semicon Co., Ltd., Cheongju, Rep. of Korea

[21] Appl. No.: 637,917

[22] Filed: Apr. 26, 1996

[30] Foreign Application Priority Data

Apr. 27, 1995 [KR] Rep. of Korea ............... 10122/1995
Oct. 16, 1995 [KR] Rep. of Korea ............... 35542/1995

[51] Int. Cl.[6] .................................................. G11C 7/00
[52] U.S. Cl. ........................ 365/204; 365/203; 365/227
[58] Field of Search .............................. 365/204, 203, 365/227

[56] References Cited

U.S. PATENT DOCUMENTS

| | | | |
|---|---|---|---|
| 5,359,555 | 10/1994 | Salter, III | 365/203 |
| 5,418,748 | 5/1995 | Monden | 365/204 |
| 5,539,700 | 7/1996 | Kawahara | 365/203 |
| 5,631,822 | 5/1997 | Naritake et al. | 365/227 |

Primary Examiner—Tan T. Nguyen
Attorney, Agent, or Firm—Fleshner & Kim

[57] ABSTRACT

An improved bit line selection circuit which is capable of preventing power consumption of Vpp by delaying an external signal for a predetermined time, first turning off the NMOS transistor connected to Vcc, turning on the PMOS transistor connected to Vpp, and preventing a formation of a current path from Vpp to Vcc, which incudes a control signal generation unit for generating a control signal by operating an external signal inputted thereto through an input node, the control signal generation unit being symmetrical; first and second bit line selection signal generation unit for generating a bit line selection signal of Vpp level in accordance with a control of the control signal generation unit; and an electric charge charging unit for charging a part of electric charges when a selection signal of the first or second bit line selection signal is discharged from Vpp to Vcc, recycling electric charge which is charged when selecting a bit line, and precharging a bit line selection signal.

19 Claims, 8 Drawing Sheets

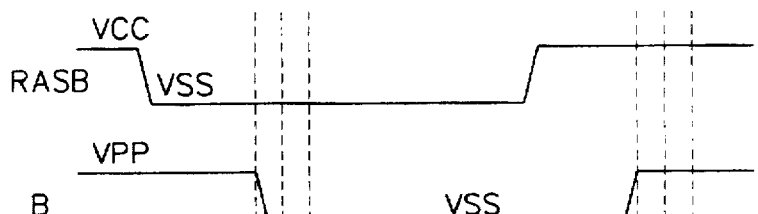
FIG.4A CONVENTIONAL ART
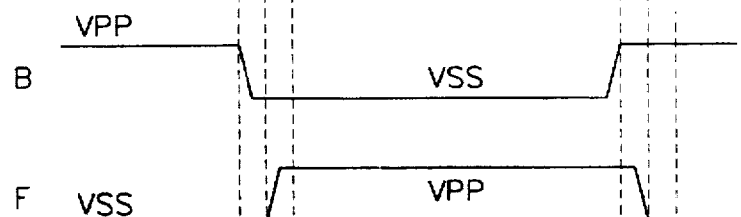
FIG.4B CONVENTIONAL ART
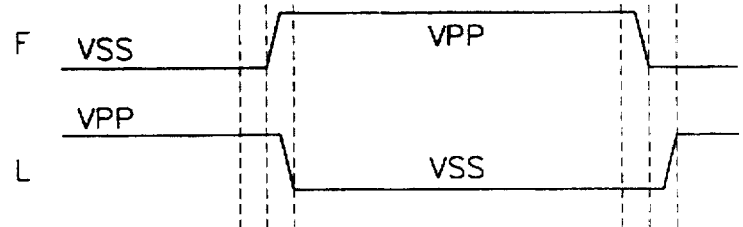
FIG.4C CONVENTIONAL ART
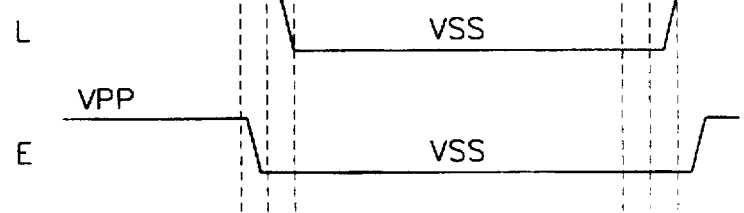
FIG.4D CONVENTIONAL ART
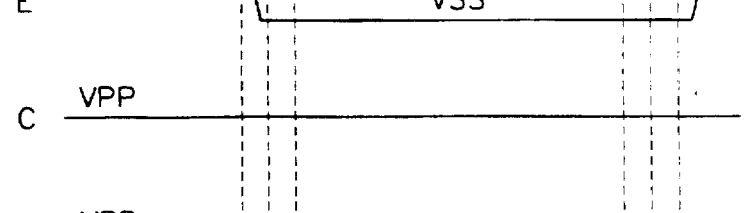
FIG.4E CONVENTIONAL ART
FIG.4F CONVENTIONAL ART
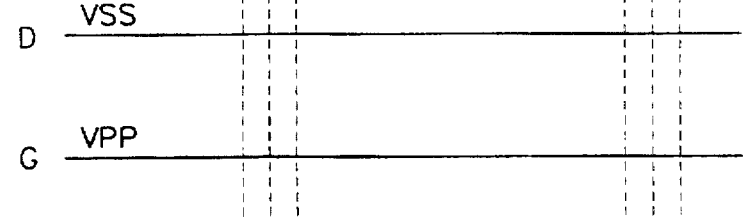
FIG.4G CONVENTIONAL ART
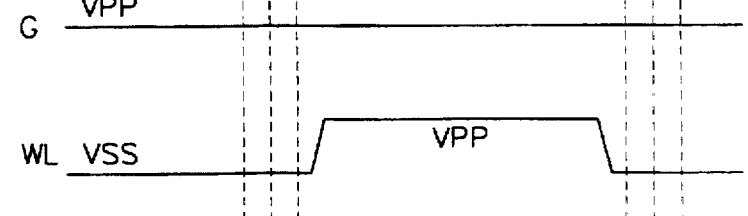
FIG.4H CONVENTIONAL ART
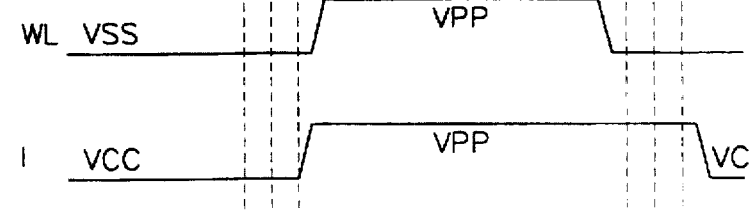
FIG.4I CONVENTIONAL ART
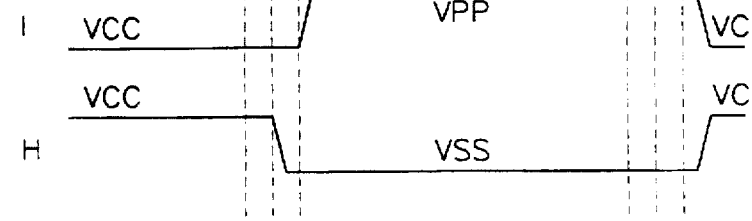
FIG.4J CONVENTIONAL ART
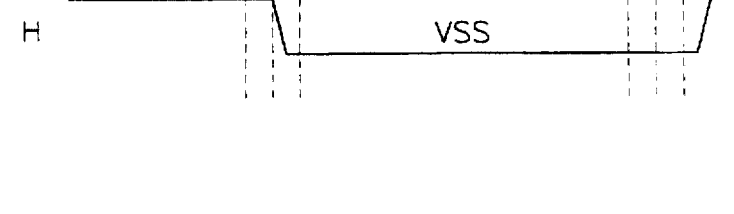
FIG.4K CONVENTIONAL ART

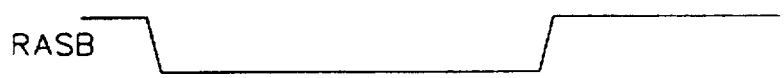
FIG.9A RASB
FIG.9B G
FIG.9C J
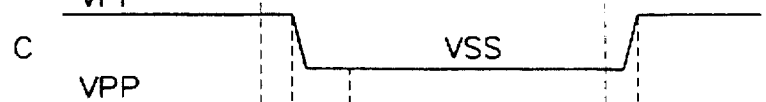
FIG.9D C
FIG.9E E
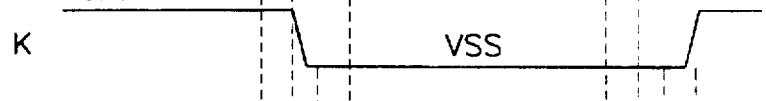
FIG.9F K
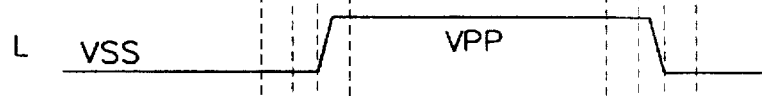
FIG.9G L
FIG.9H M
FIG.9I N
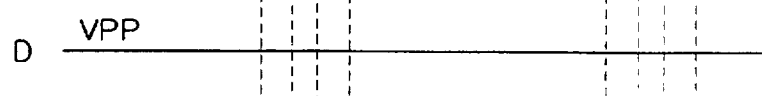
FIG.9J D
FIG.9K O
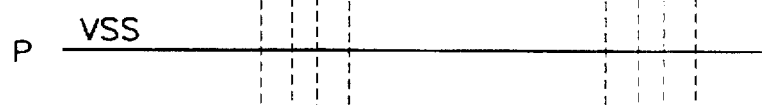
FIG.9L P
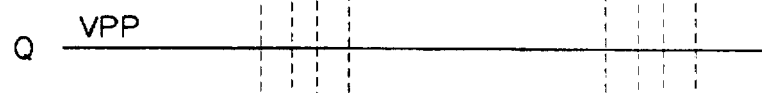
FIG.9M Q
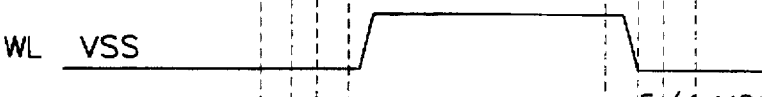
FIG.9N WL
FIG.9O H
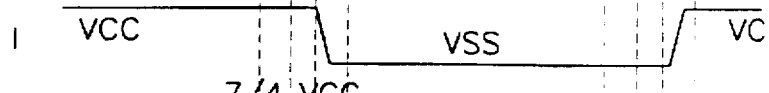
FIG.9P I
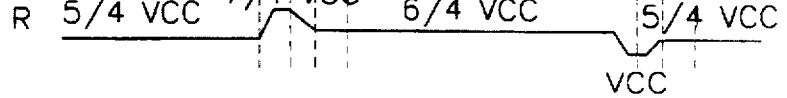
FIG.9Q R

BIT LINE SELECTION CIRCUIT

BACKGROUND OF THE INVENTION

1. Field of the Invention

The present invention relates to a bit line selection circuit, and particularly to an improved bit line selection circuit which is capable of reducing electric power consumption of an internal peak voltage Vpp when selecting a predetermined bit line from a DRAM (dynamic random access memory).

2. Description of the Conventional Art

Conventionally, FIG. 1 shows the construction of a conventional DRAM. As shown therein, a plurality of upper and lower bit lines BL and /BL sharing a bit line sense amplifier 50 are provided in the DRAM. In the drawings, BLEQ denotes a bit line equalizer.

In addition, in order to read/write a data from one bit line among the upper and lower bit lines, two NMOS transistors 50a are connected to both sides of a bit line sense amplifier 50, thus selecting one bit line among the upper and lower bit lines BL and /BL in accordance with a turning on/off operation of the NMOS transistor 50a.

Therefore, a bit line selection circuit is necessary so as to turn on/off the NMOS transistor 50a.

In addition, in the bit line selection circuit, gate bias voltage, that is, the voltage of the bit line selection signals H and I, uses an internal peak voltage Vpp which is the same as voltage supplied to the circuit when enabling the word line so that the data read from the memory cell (not shown) can be transmitted to the bit line sense amplifier 50 through the bit lines BL and /BL when turning on the NMOS transistor 50a.

Here, the internal peak voltage Vpp is referred to a predetermined voltage, which is generated in the interior of the circuit, and higher than an internal power voltage Vcc.

Therefore, as shown in FIG. 2, since a plurality of bit line selection circuits 40 are provided together with a bit line sense amplifier 50, a cell, and a block in the DRAM, it is possible to select a predetermined block.

FIG. 3 shows the construction of a conventional bit line selection circuit 40, which includes a control signal generation unit 10 for operating a signal externally inputted thereto through nodes B and C and for generating a control signal, first and second bit line selection signal generation units 20 and 30 for generating bit line selection signals H and I through nodes H and I in accordance with a control signal of the control signal generation unit 10.

The control signal generation unit 10 includes inverters 10a and 10b which sequentially delay an external signal inputted thereto through input nodes B and C, a NAND-gate 10c for NANDing an external signal inputted thereto through the input nodes B and C, a delay unit 10d for delaying an output of the NAND-gate 10c, a NOR-gate 10e for NORing outputs of the delay unit 10d and the NAND-gate 10c, and inverters 10f and log for sequentially delaying an external signal inputted thereto through an input node C.

The first bit line selection signal generation unit 20 includes a PMOS transistor 20a and an NMOS transistor 20b which are connected in series between the peak voltage Vpp and a ground voltage Vss, thus forming an output terminal 21 at a connecting point between the source and the drain and having an gate output of the inverters log and 10a, and an NMOS transistor 20c of which the drain is applied with the power voltage Vcc, the gate is applied with an output of the NOR-gate 10e, and the source is commonly connected to the output terminal 21 and the node H.

The second bit line selection signal generation unit 30 includes a PMOS transistor 30a and an NMOS transistor 30b, which are connected in series between the peak voltage Vpp and the ground voltage Vss, thus forming an output terminal 31 at a connecting point between the source and the drain and having a gate input of the inverters 10b and 10f, and an NMOS transistor 30c of which the drain is applied with the power voltage Vcc, the gate is applied with an output of the NOR-gate 10e, and the source commonly connected to the output terminal 31 and the node I.

Here, the inverters 10a, 10b, 10f, and log, the NAND-gate 10c, and the NOR-gate 10e are applied with the peak voltage Vpp as a bias voltage.

The operation of the conventional bit line selection circuit will now be explained with reference to the accompanying drawings.

To begin with, when an RASB signal is externally enabled, a predetermined block among a plurality of blocks as shown in FIG. 2 is selected, and the bit line selection circuit 40 is operated, and predetermined bit lines BL and /BL are selected from a cell 60 of the selected blocks.

That is, when an RAS signal is externally enabled, and a row address is determined, the voltage level inputted to the input nodes B and C of the bit line selection circuit 40 is changes, and then the input nodes B or C is selected.

Therefore, the input nodes B and C maintains the peak voltage Vpp at usual time. When a predetermined node is selected, the selected node is changed to Vss, and the nonselected node maintains Vpp.

Here, referring FIG. 4A, the operation that the input node B is selected in accordance with an enabled RASB signal will now be explained.

To begin with, when the input node B is selected, and then the selected input node B is changed to Vss, the input node C maintains Vpp.

Therefore, the node F of the control signal generation unit 10, as shown in FIG. 4C, becomes Vpp by the inverter 10a, and the node L becomes Vss by the inverter 10b as shown in FIG. 4D, and the node D and node G become Vss and Vpp, respectively, by the inverters 10f and 10g as shown in FIGS. 4G and 4H.

In addition, the voltages of the input nodes B and C are NANDed by the NAND-gate 10c, delayed by the delay unit 10d, and NORed with the output of the NAND-gate 10c by the NOR-gate 10e.

Thereafter, the PMOS transistor 20a of the first line selection signal generation unit 20 and the NMOS transistor 20c are turned off in accordance with Vpp of the node F and the node G and Vss of the node E, and the NMOS transistor 20b is turned on, and then Vss is outputted through the output terminal 21 and the node H as a selection signal H.

Meanwhile, in the second bit line selection signal generation unit 30, the NMOS transistors 30b and 30c are turned off in accordance with Vss of the nodes E, D and L, and Vpp is outputted through the output terminal 31 and the node I as a selection signal I.

Therefore, since the voltages of the nodes H and I which maintain Vcc in order to prevent noise at bit line before the RASB signal is enabled are changed to Vss and Vpp, respectively, in accordance with bit line selection signals H and I, the lower side NMOS transistor 50a of the bit line sense amplifier 50, as shown in FIG. 1, is turned on, and the lower side bit lines B and /B are selected.

In addition, as shown in FIG. 3, when the input node C is selected, a bit line selection signal H of Vpp is outputted through the above-explained process, and the upper side bit lines B and /B of the bit line sense amplifier 50 is selected in accordance with a selection signal H of Vpp.

As described above, in the conventional bit line selection circuit, before the RAS signal is enabled, the turned-on NMOS transistor connected to Vcc maintains Vcc, and when the RAS signal is enabled, the NMOS transistor connected to Vcc is turned off, and the PMOS transistor connected to Vpp is turned on, and bit line selection signals H and I of Vpp are outputted, and then a predetermined bit line is selected.

In addition, when the RAS signal is disabled, the PMOS transistor connected to Vpp is turned off, and the NMOS transistor connected to Vcc is turned on, and then returns to Vcc.

However, since the conventional bit line selection circuit outputs selection signals H and I of Vcc before the RAS signal is enabled, and then outputs a selection signal H or I of Vpp when the RAS signal is enabled, and when the RAS signal is disabled, since the conventional bit line selection circuit returns to Vcc, power consumption of Vpp occurs.

Since the bit line selection signals H and I have loading components such as resistance and capacitance, the consumption of Vpp accounts for more than 40% of the entire system of the DRAM.

In addition, in order to select a predetermined bit line, after the NMOS transistor connected to Vcc is turned, and then the PMOS transistor connected to Vpp is turned on. However, the above-mentioned operation is not preformed, a current path is formed at a predetermined side from Vpp to Vcc for a minute, thus disadvantageously increasing power consumption of Vpp.

SUMMARY OF THE INVENTION

Accordingly, it is an object of the present invention to provide a bit line selection circuit which overcomes the problems encountered in the conventional bit line selection circuit.

It is another object of the present invention to provide a bit line selection circuit which is capable of preventing power consumption of Vpp by partially storing electric charge when an RAS is disabled, and a bit line selection signal is discharged from Vpp to Vcc and by recharging a bit line selection signal using the stored electric charge when selecting predetermined bit line after the RAS is enabled.

It is another object of the present invention to provide a bit line selection circuit which is capable of preventing power consumption of Vpp by allowing bit line selection circuits of a plurality of blocks to share an electric charge charging unit and recharging a bit line selection signal of another block using the electric charge charging unit when selecting a predetermined bit line.

It is another object of the present invention to provide a bit line selection circuit which is capable of preventing power consumption of Vpp by delaying an external signal for a predetermined time, first turning off the NMOS transistor connected to Vcc, turning on the PMOS transistor connected to Vpp, and preventing a formation of a current path from Vpp to Vcc.

To achieve the above objects, there is provided a bit line selection circuit, which incudes a control signal generation unit for generating a control signal by operating an external signal inputted thereto through an input node, the control signal generation unit being symmetrical; first and second bit line selection signal generation unit for generating a bit line selection signal of Vpp level in accordance with a control of the control signal generation unit; and an electric charge charging unit for charging a part of electric charges when a selection signal of the first or second bit line selection signal is discharged from Vpp to Vcc, recycling electric charge which is charged when selecting a bit line, and precharging a bit line selection signal.

BRIEF DESCRIPTION OF THE DRAWINGS

FIGS. 4A through 4K are diagrams showing a timing of a conventional bit line selection circuit of FIG. 3;

FIGS. 9A through 9Q are diagrams of a signal of each element of FIG. 8 according to the present invention.

DETAILED DESCRIPTION OF THE INVENTION

Figure 6:
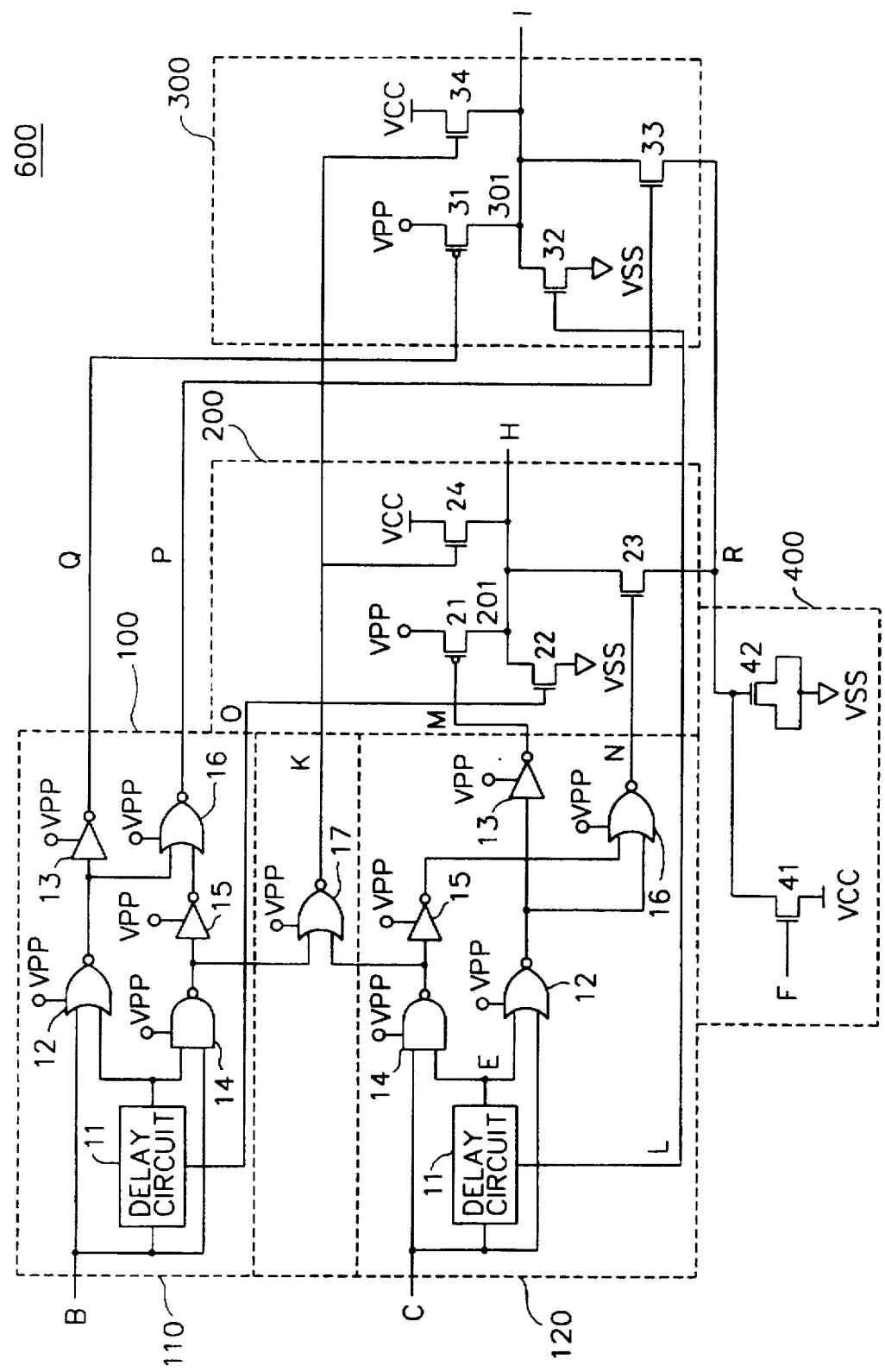
FIG. 6 is a detailed circuit of a bit line selection circuit according to the present invention.

Referring to FIG. 6, a bit line selection circuit according to the present invention includes a control signal generation unit 100 for generating a control signal by operating an external signal inputted thereto through input nodes B and C to have a symmetrical structure, first and second bit line selection signal generation units 200 and 300 for generating bit line selection signals H and I in accordance with a control of the control signal generation units 100, and an electric charge charging unit 400 for charging a partial electric charge when the selection signals H and I of the first or second bit line selection signal generation unit 200 is discharged from Vpp into Vcc, and for precharging a bit line selection signal by recycling an electric charge which is charged during a bit line selection.

The control signal generation unit 100 includes a first control signal generation circuit 110, a second control signal generation circuit 120 and a NOR-gate 17. Each of the first and second control signal generation circuits 110 and 120 includes a delay unit 11 for delaying an external signal inputted thereto through the input nodes B and C, a NOR-gate 12 for NORing an output of the delay unit 11 and an external signal, an inverter 13 for inverting an output of the NOR-gate 12, a NAND-gate 14 for NANDing an output of the delay unit 11 and an external signal, an inverter 15 for inverting an output of the NAND-gate 14, and a NOR-gate 16 for NORing an output of the inverter 15 and the NOR-gate 12. The NOR-gate 17 NORs an output of of the NAND-gate 14 of the first and second control signal generation circuits 110 and 120.

The first bit line selection signal generation unit 200 includes a PMOS transistor 21 and an NMOS transistor 22, which are connected in series between Vpp and Vss, thus forming an output terminal 201 at a connection point between the source and the drain, and in which the inverter 13 and the delay 11 are connected to the gate of the same, an NMOS transistor 23 of which the drain is connected to the output terminal 201, and the gate is connected to the NOR-gate 16, the source is connected to the node R and an NMOS transistor 24 of which the drain is connected to the Vcc terminal, the gate is connected to the NOR-gate 17, and the source is commonly connected to the output terminal 201.

The second bit line selection signal generation unit 300 includes a PMOS transistor 31 and an NMOS transistor 32, which are connected in series between Vpp and Vss, thus forming an output terminal 301 between the source and the drain, and in which the inverter 13 and the delay unit 11 are connected to the gate of the same, an NMOS transistor 33 of which the drain is connected to the output terminal 301, and the gate is connected to the NOR-gate 16, and an NMOS transistor 34 of which the drain is connected to the Vcc terminal, the gate is connected to the NOR-gate 17, and the source is commonly connected to the output terminal 301.

In addition, the electric charge changing unit 400 includes an NMOS transistor 41 of which the source is connected to the sources of the NMOS transistors 23 and 33, the drain is connected to the Vcc terminal, and the gate is provided with an external signal F, which is a pulse turning on the transistor 41 and precharging the node R to the second prescribed potential level (Vcc), and an NMOS transistor 42 is adapted for a charging operation, and is commonly connected to the source of the NMOS transistor 41.

Here, Vpp as a bias voltage is supplied to the NOR-gates 12, 16 and 17, and the inverters 13 and 15, respectively.

Figure 5:
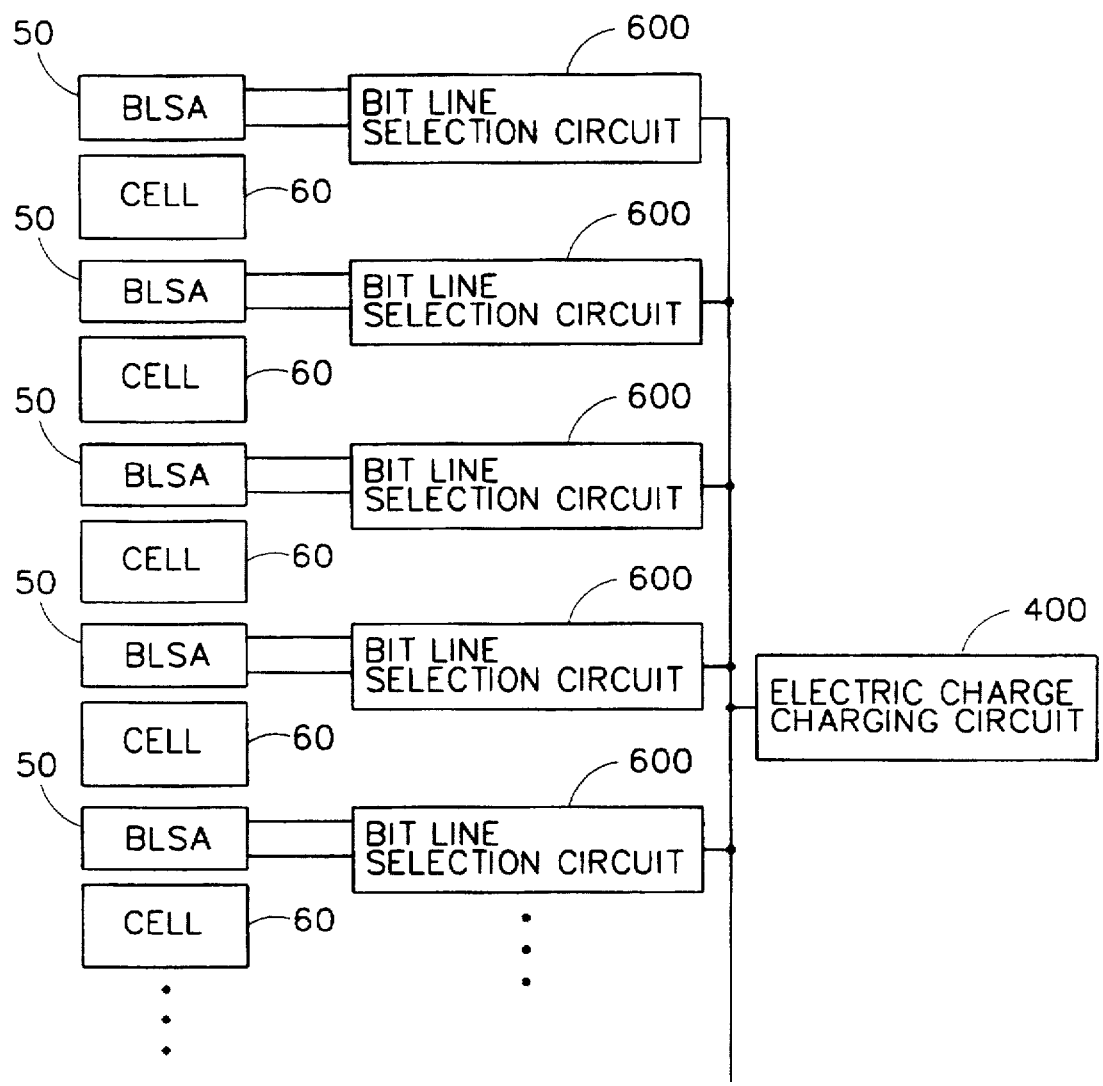
FIG. 5 is a block diagram of an interconnection between a bit line sense amplifier, a cell, and a bit line selection circuit of a DRAM according to the present invention.

FIG. 5 shows a block diagram of a bit line selection circuit having a bit line sense amplifier 50, and a cell 60. As shown therein, the electric charge charging unit 400 for recycling electric charge of Vpp is adapted so as to share a plurality of bit line selection circuits 600. Here, if necessary, a pumping circuit may be further adapted in the electric charge charging unit. After one cell is selected and disabled, the recycling electric charge is stored in the electric charge charging unit 400, and when another cell block is selected, the electric charge stored in the electric charge charging unit 400 is recycled, so that it is possible to reduce power consumption of Vpp when selecting a bit line.

The operation of a bit line selection circuit according to the present invention will now be explained with reference to the accompanying drawings.

To begin with, when an external RASB signal is enabled, a predetermined block among a plurality of blocks as shown in FIG. 5 is selected in accordance with a row address, and then the bit line selection circuit 600 is operated, and predetermined bit lines B and /B are selected to read/write from the cell 60 of the selected block.

That is, when an external RAS signal is enabled, and a row address is determined, the voltage level inputted to the input nodes B and C of the bit line selection circuit is changed, and then either the input node B or C is selected. Here, the selected input node B or C is changed to Vss.

Figure 7A:
FIGS. 7A through 7O are diagrams of a timing of a bit line selection circuit of FIG. 6 according to the present invention.
Figure 7B:
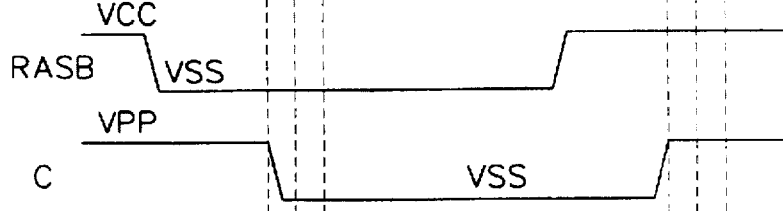
Figure 7C:
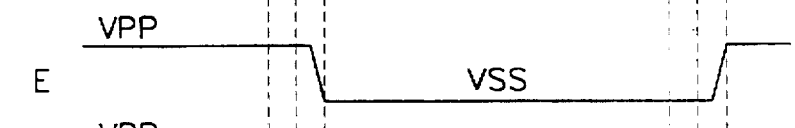

The operation that the RASB signal is enabled as shown in FIG. 7A and then the input node C is selected will now be explained.

To begin with, when the input node C, as shown in FIG. 6, is selected, the selected input node C maintains Vss, and the non-selected input node B maintains an internal peak voltage Vpp.

Figure 7D:
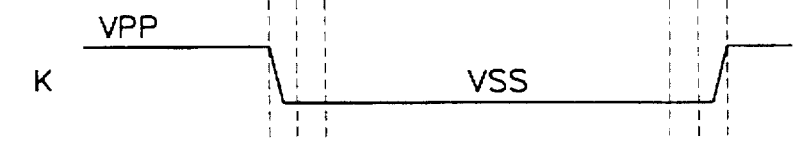
Figure 7E:
Figure 7F:
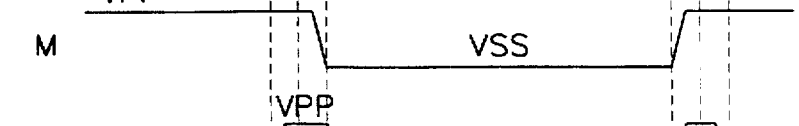

The node K of the control signal generation unit 100, as shown in FIG. 7D, is changed to Vss, and the NMOS transistor 34 of the second bit line selection signal generating unit 300 is turned off in accordance with Vss, and the node H is floated.

Figure 7G:
Figure 7H:
Figure 7I:
Figure 7J:
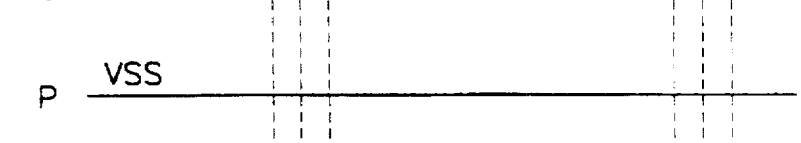
Figure 7K:
Figure 7L:
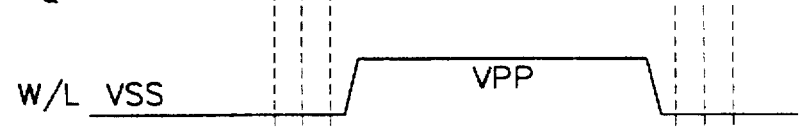
Figure 7M:
Figure 7N:
Figure 7O:
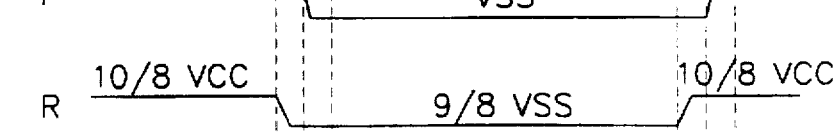

Thereafter, the PMOS transistor 31 and the NMOS transistor 33 are turned off in accordance with voltage of the nodes P and Q and Vpp of the node L outputted from the delay unit 11, and the NMOS transistor 32 is turned on, and a selection signal I of Vss as shown in FIG. 7N is outputted through the node I of the second bit line selection signal generation unit 300.

Meanwhile, the NMOS transistor 24 is turned off in accordance with voltage of the node K as shown in FIG. 7D, and then the node H of the first bit line selection signal generation unit 200 is floated. Here, the NMOS transistor 22 is turned off in accordance with voltage of the node O.

In addition, as shown in FIG. 7G, voltage of the node N having a pulse width as much as the time delay is inputted, the NMOS transistor 23 is turned on in accordance with Vpp, and electric charge which is precharged in the charging NMOS transistor 42 of the electric charge charging unit 400 is discharged, and the voltage of the node H maintaining Vcc is increased up to over Vcc.

At this time, the capacitance of the charging NMOS transistor 42 and the loading capacitance of the selection signal outputted through the node H are set to be the same, and when Vpp is 6/4 Vcc, and the threshold voltage Vtn is ¼ Vcc, the precharge level of the charging NMOS transistor 42 becomes 5/4(10/8)Vcc.

Therefore, the capacitance of the NMOS transistor 42 and the loading capacitance of the selection signal H are charge-shared, and then the electric charge of 5/4(10/8)Vcc precharged in the charging NMOS transistor 42, that is, the electric charge of the node R, is discharged and distributed through the NMOS transistor 23, and then the selection signal H outputted through the node H after an electric charge movement becomes (5/4 Vcc+Vcc)/2=9/8 Vcc as shown in FIG. 7M.

Thereafter, at the moment when the voltage of the node N as shown in FIG. 7G is changed to Vss, the voltage of the node M is changed from Vpp to Vss, and then the NMOS transistor 23 is turned off, and the PMOS transistor 21 is turned on, so that the voltage of the node H is increased up to a level of Vpp as shown in FIG. 7M, and the voltage of the node R maintains the same.

Therefore, when increasing the level of the selection signal H from 9/8 Vcc up to Vpp, the increase level becomes one fourth ((9/8 Vcc-Vcc)/2(½ Vcc)=¼) of when increasing from Vcc to Vpp, so that it is possible to save 25% of Vpp electric charge.

In addition, before the selection signal H is increased up to Vpp, the reason for turning on the NMOS transistor 32 using voltage of the node L and outputting a bit line selection signal I of Vss is that since the bit line selection signals H and I has big loading, and then a transition time is lengthy, the nonselected bit line is rapidly cut from the interconnection with the bit line sense amplifier BLSA, so that it is possible to obtain a time delay effect until the word line, as shown in FIG. 7L, is enabled.

However, when the above-mentioned time delay is not necessary, the voltage of the node M is inverted, and then applied to the NMOS transistor 32, it is possible to set the bit line selection signal I as Vss.

Therefore, an upper bit line of the bit line sense amplifier BLSA is selected in accordance with a selection signal H of Vpp level, and then a data read/write operation is performed through the bit line sense amplifier BLSA.

When the data read/write operation of the data is finished, and the RASB signal is disabled as shown in FIG. 7A, the voltage of the input node C is disabled to Vpp, and the voltage of the node M is changed to Vpp, and then the PMOS transistor 21 is turned off.

As shown in FIG. 7G, the NMOS transistor 23 is turned on in accordance with a voltage of the node N which is changed to Vpp, and the capacitance of the charging NMOS transistor 42 and the loading capacitance of the bit line selection signal H are charge-shared in accordance with a turning-on of the NMOS transistor 23, and then the capacitance storing voltage of the charging NMOS transistor 42 becomes (6/4 Vcc+9/8 Vcc)/2=10/8(5/4)Vcc.

Therefore, the voltage level which is precharged into the charging NMOS transistor 42 is set as 5/4(10/8)Vcc while the RASB signal is changed during cycles.

Thereafter, after the voltage of the node N is disabled, the voltage of the node K is changed to Vpp as shown in FIG. 7D, the NMOS transistor 24 is turned on, and the bit line selection signal H returns to Vcc.

In addition, the role of the NMOS transistor 41 is to precharge the voltage of the node R during the power-up of the chip up to Vcc. Here, when the NMOS transistor 41 is not present, the node R is floated when the chip is first operated, and the electric potential of the node R during the charge sharing drops below Vcc, so that electric charge is lost more.

Therefore, since the NMOS transistor 41 is turned on in accordance with the input signal F during a power-up of the chip, electric charge loss is prevented during the first cycle of the RAS signal by precharging the voltage of the node R to Vcc.

Meanwhile, when the input node B is selected as shown in FIG. 5, the selection signal I is outputted through the above-mentioned process, and the lower bit lines B and /B of the bit line sense amplifier BLSA is selected in accordance with a selection signal I of Vpp level.

Figure 8:
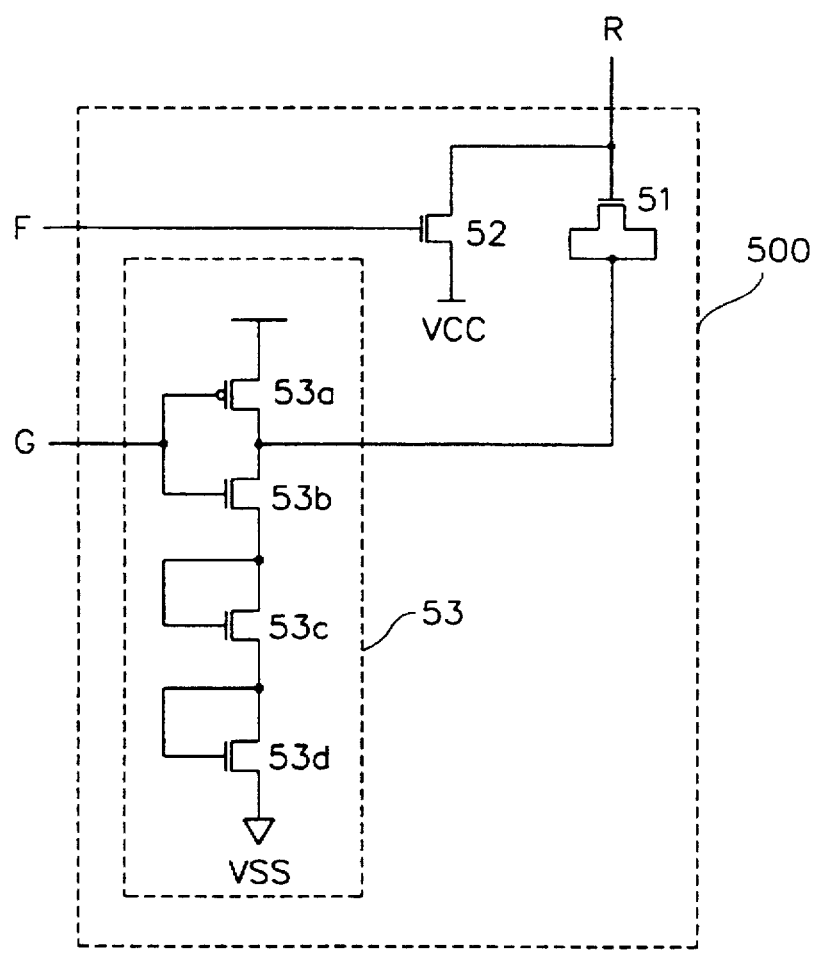
FIG. 8 is a circuit of an electric charge charging unit according to another embodiment of the present invention.

FIG. 8 shows an electric charging unit of a bit line selection circuit according to a second embodiment of the present invention. As shown therein, the electric charge charging unit 500 includes a charging NMOS transistor 51 for charging electric charge, an NMOS transistor 52 for preventing the voltage level of the node R from dropping below Vcc during a charge sharing for recycling electric charge after charging electric charge, and an inverter 53 for pumping a charging electric potential of the charging NMOS transistor 51 and for increasing a recycling electric charge during a charge sharing.

Here, the inverter 53 includes a PMOS transistor 53a and NMOS transistors 53b, 63c, and 53d which are connected in series between Vcc and Vss. The NMOS transistors 53c and 53d have the gate and the drain connected to each other, and the gates of the PMOS transistor 53a and the NMOS transistor 53b are applied with an external signal G, and a connection point between the source and the drain is connected to the NMOS transistor 51.

The operation of the electric charge charging unit 500 will now be explained with reference to the accompanying drawings.

To begin with, referring to FIG. 6, before the input node C is changed to Vss in accordance with an enabling of the RASB signal, when a signal of Vss is inputted into the inverter 53 as shown in FIG. 9B, the voltage Vcc if the node J maintaining ½ Vcc by the NMOS transistors 51c and 51d is increased up to a level of Vcc, and the electric potential of the charging NMOS transistor 51 is increased as much as a swing width compared to the previous electric potential.

Here, under assumptions that the node R and the capacitance of the bit line selection signal H are the same, and the precharge level of the charging NMOS transistor 51 is 5/4 Vcc, and the threshold voltage of the NMOS transistors 53c and 53d are ¼, the output swing width of the node J becomes ½ Vcc by the NMOS transistors 53c and 53d, and then the electric potential of the node R becomes (5/4 Vcc+½ Vcc)=7/4 Vcc as shown in FIG. 9Q.

Thereafter, when the RASB signal is enabled, and the input node C is changed to Vss, the NMOS transistors 23 and 34 are turned on in accordance with a voltage of the node K as shown in FIG. 9F, and then the bit line selection signals H and I are floated. In addition, when the NMOS transistor 23 is turned on in accordance with a voltage of the node N, there is formed a charge sharing between the electric charge which is precharged in the charging NMOS transistor 51 and the voltage of the node H.

Here, when the capacitance of the charging NMOS transistor 51 is the same as the loading capacitance of the node H, the voltage level of the node H should be (7/4 Vcc+Vcc)/2=11/8 in accordance with the charge sharing. However, the voltage of the node H is smaller by the threshold voltage (¼ Vcc) than the voltage of Vpp(6/4 Vcc) inputted to the gate of the NMOS transistor 23.

Therefore, as shown in FIGS. 9O and 9Q, the voltages of the node R and the node H become 6/4 Vcc and 5/4 Vcc, respectively, after the charge sharing is finished.

At the moment when the voltage of the node N as shown in FIG. 9I is changed to Vss, the voltage of the node M as shown in FIG. 9H is changed from Vpp to Vss, and then the NMOS transistor 23 is turned off, and the PMOS transistor 21 is turned on, and then the level of the node H is increased from 5/4 Vcc to 6/4 Vcc (Vpp) as shown in FIG. 9O.

Therefore, when increasing the level of the selection signal H from 5/4 Vcc to Vpp, since only about (5/4 Vcc-Vcc)/(½ Vcc)=½ is necessary compared to the case when increasing from 5/4 Vcc to Vpp, it is possible to save the Vpp electric charge by 50% since a half of the necessary Vpp electric charge is supplied from the charging NMOS transistor 51.

Here, the reasons for using a pumping theory is to increase the amount of the recycling electric charge, and the reason for reducing the swing width using the NMOS transistors 51c and 51d of the inverter 53 is to prevent over use of the power Vcc.

Therefore, the upper bit line of the bit line sense amplifier BLSA is selected in accordance with a selection signal H of Vpp level, and then a data read/write operation of the data is performed by the bit line sense amplifier BLSA.

When the data read/write operation of the data is finished, and the RASB signal is disabled as shown in FIG. 9A, the voltage of the input node C is disabled, and the voltage of the node M is changed to Vpp, and then the PMOS transistor 21 is turned off.

In addition, when the external input signal G is changed to the level of Vss as shown in FIG. 9B, the voltage of the node J is reduced to ½ Vcc as shown in FIG. 9C, and the electric potential of the node R is reduced from 6/4 Vcc to ½ Vcc, that is, the reduced electric potential becomes Vcc.

Thereafter, when the electric potential of the node N is changed to Vpp level, the NMOS transistor 23 is turned on, and thereby a charge sharing occurs between the voltage of the node H and the voltage of the node R. As the electric charge of the node H is moved to the node R, the voltages of the node R and the node H become 5/4 Vcc after the charge sharing is finished as shown in FIGS. 9O and 9Q.

In addition, when the input node B as shown in FIG. 6 is selected, the selection signal I is outputted through the same process above, and the lower bit lines B and /B of the bit line sense amplifier BLSA is selected in accordance with a selection signal I of Vpp level.

Figure 1:
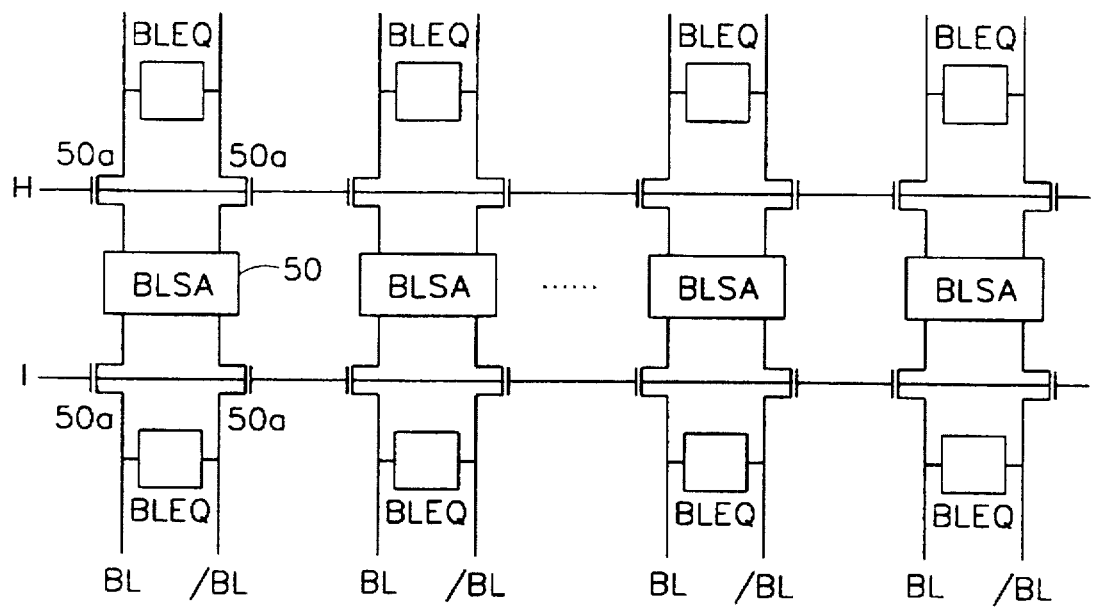
FIG. 1 is a schematic diagram of a bit line sharing a sense amplifier of a conventional DRAM.
Figure 2:
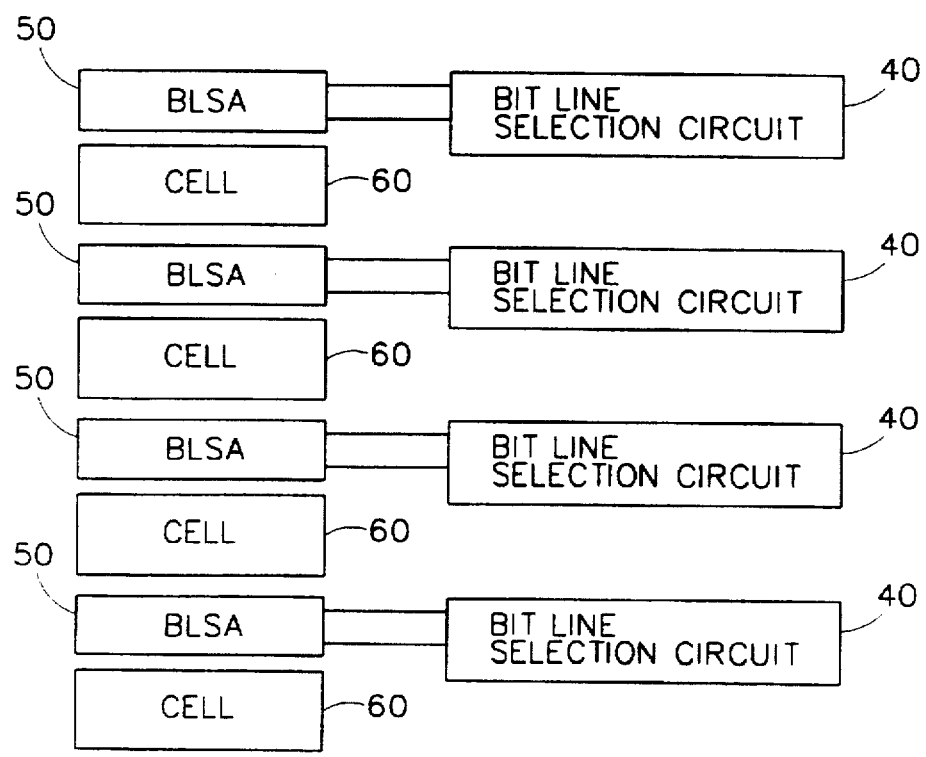
FIG. 2 is a block diagram of an interconnection between a bit line sense amplifier, a cell, and a bit line selection circuit of a conventional DRAM.
Figure 3:
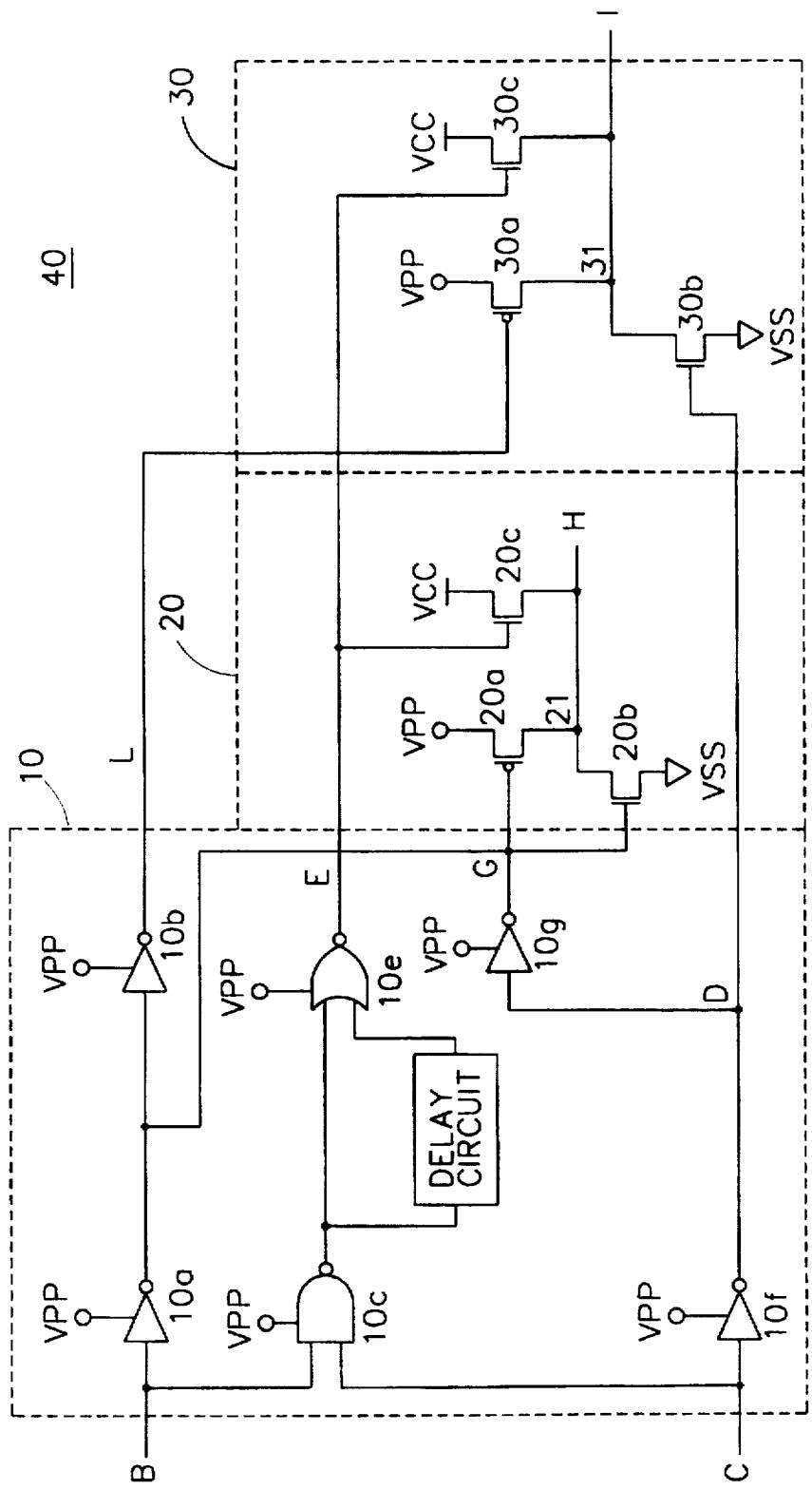
FIG. 3 is a detailed circuit diagram of a conventional bit line selection circuit.

In addition, as shown in FIG. 1, the electric charge charging unit is adapted so that a plurality of bit line selection circuits can be shared. That is, when one cell is selected, and then disabled, the recycling electric charge is stored in the electric charge charging units 400 and 500, and when another cell is selected, the electric charges stored in the electric charge charging units 400 and 500 are recycled, so that it is possible to reduce power consumption of the internal peak voltage Vpp which occur more when outputting bit line selection signals H and I.

As described above, the bit line selection circuit according to the present invention is directed to reducing power consumption of Vpp by storing part of electric charge into an electric charge charging unit, which is generated while an RAS is disabled, and a bit line selection signal is discharged from Vpp to Vcc and recycling stored electric charge when a predetermined bit line is selected.

In addition, the present invention is directed to reducing consumption of Vpp electric charge by 50% by allowing the bit line selection circuits to share an electric charge charging unit, recycling electric charge stored in the electric charge charging unit when selecting a bit line, and precharging a bit line selection signal of another block.

The present invention is directed to reducing power consumption of Vpp by turning off the NMOS transistor connected to Vcc by delaying an external signal for a predetermined time, then turning-on the PMOS transistor connected to Vpp, and preventing a current path formation from Vpp to Vcc.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A bit line selection circuit, comprising:
   a control signal generation unit for generating a control signal by operating an external signal inputted thereto through an input node;
   first and second bit line selection signal generation unit for generating a bit line selection signal of a first prescribed potential level in accordance with a control of the control signal generation unit; and
   an electric charge charging unit for charging a part of electric charges when a selection signal of the first or second bit line selection signal is discharged from the first prescribed potential level to a second prescribed potential level, recycling electric charge which is charged when selecting a bit line, and precharging a bit line selection signal.

2. The circuit of claim 1, wherein said control signal generation unit includes first and second control signal generation circuits each of said first and second control signal generation circuits comprising:
   a delay unit for delaying an external signal inputted thereto through an input node for a predetermined time;
   a first NOR-gate for NORing an output signal of the delay unit and an externally applied signal;
   a first inverter for inverting an output signal of the first NOR-gate;
   a NAND-gate for NANDing an output of the delay unit and an external signal;
   a second inverter for inverting an output of the NAND-gate; and
   a second NOR-gate for NORing an output signal of the second inverter and the output of the first NOR-gate,
   wherein said control signal generation unit further includes a third NOR-gate for NORing respective output signal of the NAND-gates of said first and second control signal generation circuits.

3. The circuit of claim 2, wherein said delay unit is directed to forming a current path between the second prescribed potential level and the first prescribed potential level in the first and second bit line selection signal generation unit by delaying the external signal.

4. The circuit of claim 1, wherein said electric charge charging unit includes:
   a charging NMOS transistor for charging electric charge; and
   an NMOS transistor for preventing voltage of a node coupled to said first and second bit line selection signal generation unit from dropping below Vcc when charge-sharing so as to recycle electric charge after charging electric charge.

5. The circuit of claim 4, wherein said electric charge charging unit further includes a pumping means for pumping an electric charge of the charging NMOS transistor and for increasing a recycle electric charge when charge-sharing.

6. The circuit of claim 5, wherein said pumping means includes a PMOS transistor and first, second, and third NMOS transistors which are connected in series between Vcc and Vss, of which the second and third NMOS transistor are connected with the gate and the drain, and the gates of the PMOS transistor and the first NMOS transistor are applied with an external signal, and a connection point between the source and the drain is connected to the charging NMOS transistor.

7. The circuit of claim 6, wherein a swing width of said inverter is limited by the second and third NMOS transistor.

8. The circuit of claim 5, wherein said electric charge charging unit is directed to precharging a bit line selection signal of another block by recycling electric charge stored in the electric charge charging unit when selecting a bit line, so that a bit line selection circuit of a plurality of blocks can be shared.

9. A bit line selection circuit of claim 1, wherein the first prescribed potential level is an internal peak voltage, and the second prescribed potential level is an internal power voltage.

10. A charging unit for sharing a prescribed amount of charges at a node of a selection circuit of a memory device, comprising:
    a first transistor for preventing a potential at the node from falling below a first potential level; and
    a capacitor for storing charges coupled between the node and a second potential level.

11. The charging unit of claim 10, wherein said first transistor includes:
    a control electrode for receiving a first control voltage,
    a first electrode for receiving a third potential level, and
    a second electrode for coupling with the node.

12. The charging unit of claim 11, wherein said first transistor is an NMOS transistor.

13. The charging unit of claim 11, wherein the first and third potential levels are source voltages and the second potential level is a ground voltage.

14. The charging unit of claim 10, wherein said capacitor comprises a second transistor having:

a control electrode for coupling with the node, and first and second electrodes for receiving the second potential level.

15. The charging unit of claim 14, wherein said second transistor is an NMOS transistor.

16. The charging unit of claim 10 further comprising a pumping means for pumping the amount of charge of said first transistor and for increasing charge sharing between the charging unit and the selection circuit.

17. The charging unit of claim 16, wherein said pumping means comprises a plurality of transistors coupled in series, each having a control electrode and first and second electrodes, said capacitor coupled to a serial connection of the first electrodes of two transistors of said plurality of transistors.

18. The charging unit of claim 17, wherein said plurality of transistors comprises first, second, third and fourth transistors respectively coupled in series, the control electrodes of said first and second transistors being coupled for receiving a second control voltage and first electrodes of said first and second transistors being coupled to said capacitor, and the control electrode and the first electrode of said third and fourth transistors being coupled to each other.

19. The charging unit of claim 18, wherein said first transistor is a PMOS transistor, and said second, third and fourth transistors are NMOS transistors.

* * * * *